(12) United States Patent
Van Schendel et al.

(10) Patent No.: US 6,940,442 B2
(45) Date of Patent: Sep. 6, 2005

(54) ANALOG-TO-DIGITAL CONVERSION OF A RADIOCOMMUNICATION SIGNAL

(75) Inventors: Laure Van Schendel, Paris (FR); Pierre Force, Nezel (FR)

(73) Assignee: Nortel Networks France, Chateaufort (FR)

( * ) Notice: Subject to any disclaimer, the term of this patent is extended or adjusted under 35 U.S.C. 154(b) by 92 days.

(21) Appl. No.: 10/333,032

(22) PCT Filed: Jul. 13, 2001

(86) PCT No.: PCT/FR01/02290
§ 371 (c)(1),
(2), (4) Date: Aug. 8, 2003

(87) PCT Pub. No.: WO02/07320
PCT Pub. Date: Jan. 24, 2002

(65) Prior Publication Data
US 2004/0012513 A1 Jan. 22, 2004

(30) Foreign Application Priority Data
Jul. 17, 2000 (FR) .......................... 00 09315

(51) Int. Cl.⁷ .............................. H03M 1/12
(52) U.S. Cl. ..................... 341/155; 341/166
(58) Field of Search ............... 341/155, 166; 455/239.1, 234.2; 375/345, 132

(56) References Cited

U.S. PATENT DOCUMENTS

| | | | |
|---|---|---|---|
| 5,574,984 A | 11/1996 | Reed et al. | 455/69 |
| 5,841,385 A | 11/1998 | Xie | 341/139 |
| 5,914,989 A * | 6/1999 | Thapar et al. | 375/341 |
| 6,047,035 A | 4/2000 | Yellin | 375/346 |
| 6,104,331 A * | 8/2000 | Ishida et al. | 341/155 |
| 6,314,278 B1 * | 11/2001 | Zamat | 455/239.1 |

FOREIGN PATENT DOCUMENTS

WO     WO 00/30260     5/2000     ............ H03M/1/18

* cited by examiner

Primary Examiner—Peguy JeanPierre
(74) Attorney, Agent, or Firm—Trop, Pruner & Hu, P.C.

(57) ABSTRACT

A method for analog/digital conversion of a radiocommunication signal using an analog analog/digital converter preceded by variable gain amplifier, wherein the frequency band of the converted signal contains at least one useful channel, comprises steps for controlling the value of the gain of the amplifier in such a way that the power in the frequency band of the converted signal is less than a limit saturation value of the analog/digital converter. However, the power in the useful channel is substantially equal to a mean power level having a first predetermined value in the case of static propagation in the useful channel or a second predetermined value, different from said first predetermined value, in the case of dynamic propagation in the useful channel.

21 Claims, 4 Drawing Sheets

ANALOG-TO-DIGITAL CONVERSION OF A RADIOCOMMUNICATION SIGNAL

This application is a 371 of PCT/FR01/02290 filed on Jul. 13, 2001.

FIELD OF THE INVENTION

The present invention relates to a method of analog/digital conversion of a radiocommunication signal, with the aid of an analog/digital converter preceded by a variable-gain amplifier. The converted signal has a determined frequency band containing at least one useful channel, in general from among several different channels. A useful channel is the frequency band of minimum width making it possible to recover a useful signal.

The invention finds applications in radiofrequency receivers, such as may be found for example in the fixed equipment (base stations) or the mobile equipment (portable terminals) of radiocommunication systems. In such an application, the signal considered is for example a radiofrequency signal such as a phase-modulated and/or amplitude-modulated carrier, or a signal resulting from the transposition of such a signal to an intermediate frequency or to baseband. The useful signal contains information coding voice and/or data and/or signaling information.

BACKGROUND OF THE INVENTION

In state of the art receivers, the frequency band of the converted signal corresponds to the useful channel. Accordingly, the radiofrequency signal received on a reception antenna is filtered, in general after transposition to an intermediate frequency or to baseband, by means of a filter disposed in the reception chain upstream of the analog/digital converter. In this way, the latter converts only the energy of the signal in the useful channel. When the receiver is a multichannel receiver, channel selection means, comprising a selective filter, make it possible to select the useful channel from among a plurality of different channels. In a manner known per se, a variable-gain amplifier can precede the analog/digital converter in the reception chain, so as to tailor the power level in the useful channel to the input dynamic swing in power of the converter. This is achieved by virtue of appropriate automatic gain control means.

Attempts are currently being made to dispose the analog/digital converter nearer to the reception antenna, and in particular upstream of the channel selection means. Hence, the signal converted by the analog/digital converter has a determined frequency band containing at least one useful channel, in general from among several different channels. The width of the frequency band of the converted signal, or converted band, is then greater than that of the useful channel. This converted band is determined by the (analog) filters disposed upstream of the converter. The channel selection means, disposed downstream of the analog/digital converter in the reception channel, then comprise a mixer and one or more digital filters for selecting the useful channel, before digital demodulation and decoding.

However, the power of the radiofrequency signal received on the reception antenna varies over time. These variations may be due to the appearance or the disappearance of obstacles between the transmitter and the receiver, to the appearance or the disappearance of other signals in the frequency band occupied by the signal, or to "fading" when there is a relative motion of the receiver with respect to one of the transmitters. One speaks of propagation of dynamic type in a channel when there is a relative motion of the receiver with respect to the corresponding transmitter, and of propagation of static type in the converse case. Fading is considerable when the Doppler frequency of $f_0 \times v/c$ is considerable, where fo is the central frequency of the channel, v is the relative speed of the receiver with respect to the transmitter and c is the speed of light. It is noted that when a signal is situated in a "fading hole" its power may become very small. The decrease in power of the signal in a "fading hole" is of short duration. In fact, the shorter the duration of the "fading hole", the smaller the power of the signal in the "fading hole".

Moreover, the input dynamic swing in power of the analog/digital converter is limited above by an upper limit value beyond which the converter is saturated, and below by a lower limit value beneath which the signal can no longer be distinguished from the noise introduced by the converter. One speaks of saturation value to designate said upper limit value, and of noise floor to designate said lower limit value. By convention, the desired power levels and the mean power values indicated subsequently in this document may be expressed in decibels (dB) with respect to the noise floor of the converter.

Furthermore, any radiocommunication system complies with specifications which determine the sensitivity and the rejection of the system with regard to the useful channel, as a function of the type of propagation in this channel. The sensitivity of the system corresponds to the minimum power level of the signal in the useful channel (signal-to-noise ratio), at which the system must still operate. The rejection of the system corresponds to the maximum power level which must be tolerated by the system inside the converted band, in the channels neighboring the useful channel. The sensitivity in the static case is less than the sensitivity in the dynamic case, and the rejection in the static case is greater than the rejection in the dynamic case. In one example, the dynamic sensitivity is equal to 15 dB above the noise floor of the converter, and the dynamic rejection is equal to 45 dB. Moreover, the static sensitivity is equal to 7 dB above the noise floor of the converter and the static rejection is equal to 70 dB. The input dynamic swing in power of the converter which is necessary is therefore equal to 60 dB in the dynamic case, to 77 dB in the static case, and hence to 85 dB to cover both the static case and the dynamic case if the useful signal level is fixed at the same level in both cases. At a rate of 6 dB per digit, a converter operating on 15 bits at output is therefore necessary.

SUMMARY OF THE INVENTION

An object of the present invention is to propose a method and a device which make it possible to use a converter operating on a smaller number of bits at output, and which is therefore less expensive.

Accordingly, the invention proposes a method of analog/digital conversion of a radiocommunication signal with the aid of an analog/digital converter preceded by a variable-gain amplifier, the frequency band of the converted signal containing at least one useful channel, consisting in controlling the value of the gain of the amplifier in such a way that the power in the frequency band of the converted signal is less than a limit saturation value of the analog/digital converter and that the power in the useful channel is substantially equal to a mean power level having a first predetermined value in the case of static propagation in the useful channel or a second predetermined value, different from said first predetermined value, in the case of dynamic propagation in the useful channel.

By distinguishing the static case from the dynamic case, it is possible to decrease the input dynamic swing in power of the converter. Thus, returning to the values of the example above, the values of the gain of the amplifier can be controlled in such a way that the power in the useful channel is substantially equal to 7 dB above the noise floor of the converter in the static case, and to 15 dB above the noise floor of the converter in the dynamic case. In this way, the input dynamic swing in power of the converter which is necessary to cover both cases is equal to 77 dB. A converter operating on 13 bits at output is therefore sufficient, and is much less expensive than a converter operating on 15 bits at output.

The invention also proposes a device for analog/digital conversion of a radiocommunication signal whose frequency band contains at least one useful channel, comprising an analog/digital converter preceded by a variable-gain amplifier, and means for controlling the value of the gain of the amplifier in such a way that the power in the frequency band of the converted signal is less than a limit saturation value of the analog/digital converter and that the power in the useful channel is substantially equal to a desired mean power level in the useful channel having a first predetermined value in the case of static propagation in the useful channel or a second predetermined value, different from said first predetermined value, in the case of dynamic propagation in the useful channel.

The invention further proposes a radiofrequency radiocommunication receiver incorporating such a device.

DETAILED DESCRIPTION

Figure 1:
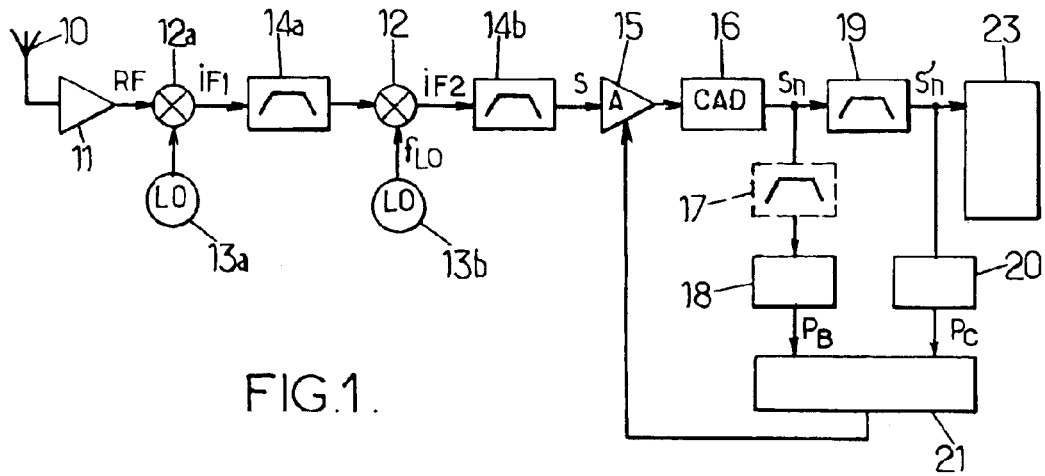
FIG. 1 is the simplified diagram of a radiofrequency radiocommunication receiver incorporating a device according to the invention.

Represented in FIG. 1 is the diagram of a radiofrequency receiver incorporating a device according to the invention. The receiver comprises a reception antenna 10 linked to the input of a radiofrequency amplifier 11 which outputs a radiofrequency signal RF. This is for example a phase-modulated and/or amplitude-modulated signal. In one example, the spectrum of the RF signal lies in the 380–500 MHz band. It comprises several distinct channels which are, for example, all of the same width.

The RF signal is carried to a first input of a first mixer 12a. A second input of the mixer 12a receives a signal at a frequency $f_{LO1}$ less than the frequency of the RF signal, delivered by a first local oscillator 13a. In one example, the frequency $f_{LO1}$ is equal to 154 MHz. The mixer 12a outputs a signal IF1 which corresponds to the RF signal transposed to the intermediate frequency $f_{LO1}$. The signal IF1 is filtered by means of a first bandpass filter 14a. The output of the filter 14a is linked to a first input of a second mixer 12b. A second input of the mixer 12b receives a signal at a frequency $f_{LO2}$ less than the frequency $f_{LO1}$ of the signal IF1, delivered by a second local oscillator 13b. In one example, the frequency $f_{LO2}$ is equal to 500 KHz. The mixer 12a outputs a signal IF2 which corresponds to the RF signal transposed to the intermediate frequency $f_{LO2}$. The signal IF2 is filtered by means of a second bandpass filter 14b. The signal IF2 thus filtered corresponds to the radiocommunication signal S according to the invention.

The device according to the invention comprises a variable-gain amplifier 15 whose input is linked to the output of the filter 14b so as to receive the signal S, and whose output delivers the amplified signal S. The device further comprises an analog/digital converter 16 whose input is linked to the output of the amplifier 15 so as to receive the amplified signal S and whose output delivers discrete instantaneous values or samples Sn of this signal. The sampling frequency $f_e$ of the converter 16 is for example equal to 2 MHz, complying with the Shannon condition.

Specifically, by reason of the passband of the bandpass filters 14a and 14b, the frequency band of the signal S, called the converted band, is around 150 KHz wide. Stated otherwise, it is assumed that the rejection, in terms of power, is big enough outside of this band for it to be possible to neglect the spectral components of the signal S outside of this band. Moreover it is centered on the frequency 500 KHz. In one example, a useful channel lying in the converted band is considered to be centered on the frequency 450 KHz. The converted band comprising several channels such as the useful channel, the bandwidth of this channel is less than that of the converted band.

The device comprises a unit 18 for measuring the power in the converted band, whose input receives the samples Sn, possibly but not necessarily via a digital filter 17 whose passband corresponds to the width of the converted band. The device also comprises a unit 20 for measuring the power in the useful channel, whose input receives the samples Sn via a channel selection module 19. The module 19 comprises means of digital transposition, for transposing the useful channel to baseband. In the example, these means comprise a digital mixer making it possible to transpose the converted band in such a way that it is centered on 50 KHz. The useful channel is then centered on 0 Hz. The module 19 also comprises digital means of low-pass filtering making it possible to isolate the components of the useful signal. The samples S'n output by the module 19 are also transmitted to the downstream part 23 of the radiofrequency receiver, which here is represented overall by a box. This downstream part 23 comprises in particular the means of demodulation and of decoding of the useful signal, which make it possible to extract the data transmitted in the useful signal.

The units 18 and 20 produce respectively values $P_B$ of the power in the converted band and values $P_C$ of the power in the useful channel, which are provided at the input of a management unit 21 of the device. Preferably, the device comprises, for example, in the power measuring units 18 and 20, means for compensating for the difference of delay in the transmission of the values $P_B$ and $P_C$ which is due to the difference of the paths taken. This makes it possible to deliver at the input of the unit 21 values of the power in the converted band and in the useful channel referring to identical samples Sn. The management unit 21 comprises means for implementing a method according to the invention, and outputs a control signal for an automatic gain control module 22. The module 22 produces an analog signal which is carried to a gain control input of the variable-gain amplifier 15, so as to control the gain of this amplifier in the manner which will now be described.

The gain of the amplifier is preferably controlled as a function of values of the mean power in the converted band and/or in the useful channel, in order for the device not to be too sensitive to the slight fluctuations in the power of the signal received. Specifically, taking account of values of the instantaneous power would give rise to changes in the gain of the amplifier which could prove to be inopportune in the sense that they might destabilize the reception chain. The values of the mean power are calculated over a determined time window. The larger this time window, the less sensitive is the device to the fluctuations in the power of the signal received. From another point of view, the measurement of the mean power of the signal is then available only after the expiry of this time window. This lag may be penalizing in certain cases, in particular on switching on the receiver. Specifically, it causes a delay in the adjusting of the reception chain which takes place in a receiver initialization phase.

This is why, according to an advantageous characteristic of the invention, the units 18 and 20 each produce N series of values, denoted $P_1n$ to $P_Nn$ in what follows, of the mean power respectively in the converted band (aforesaid values $P_B$) and in the useful channel (aforesaid values $P_C$), where N is an integer, the values of these series being calculated over increasing time windows of respective width. In one example, N is equal to 5.

Figure 2:
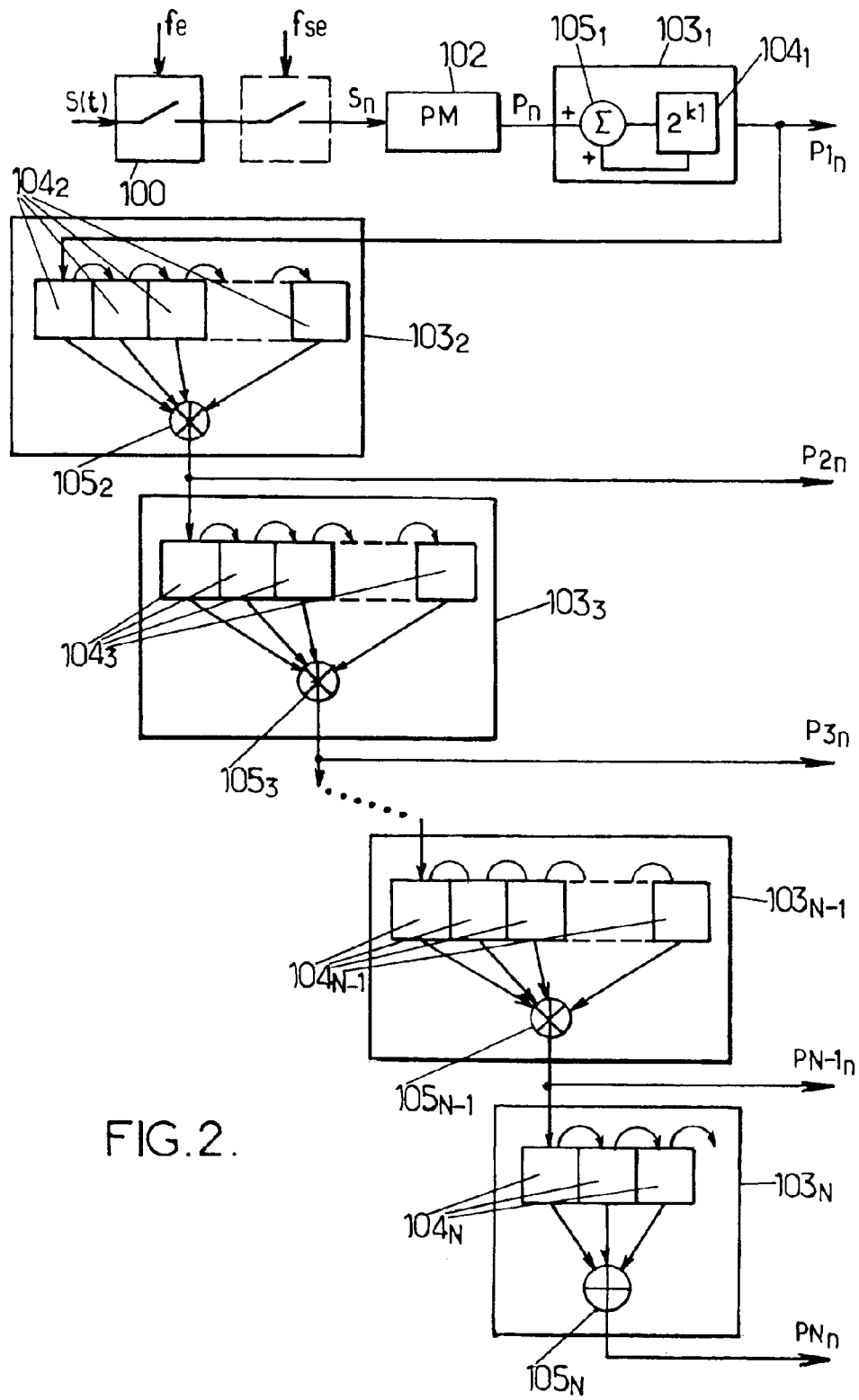
FIG. 2 is the diagram of a unit for measuring the power in the converted band or in the useful channel.

Represented in FIG. 2 is the simplified diagram of a power measurement unit such as the aforesaid unit 18 or the unit 20. In what follows, the terms "input signal" used with reference to the units 18 and 20 designate the signal corresponding respectively to the series of samples Sn and S'n provided as input to the units 18 and 20, that is the samples of the signal in the converted band and in the useful channel respectively. For the unit 18, the series of values $P_1n$ to $P_Nn$ correspond to the values of the power in the converted band which are indicated overall by the reference $P_B$ in FIG. 1, while for the unit 20, the values $P_1n$ to $P_Nn$ correspond to the values of the power in the useful channel which are indicated overall by the reference $P_C$ in FIG. 1. The description of a power measurement unit which follows with reference to FIG. 2 relates to the example of the unit 18 receiving the series of samples Sn as input signal. Given that the unit 20 is identical to the unit 18, this description also holds, with the necessary alterations to the notation, for the unit 20 receiving the series of samples S'n as input signal.

The power measurement unit of FIG. 2 optionally comprises a subsampling module 101 which carries out a subsampling of the samples of the input signal, at a subsampling frequency $f_{se}$ which is a submultiple of the sampling frequency $f_e$. In one example, $f_{se}=f_e/125$, so that one sample Sn out of 125 is transmitted by the module 101. The values of the samples Sn are for example coded on p bits, where p is an integer.

The unit further comprises a module 102 for calculating instantaneous power receiving as input the series of values Sn. This module has the function of producing a series of values Pn of the instantaneous power of the input signal, from the series of values Sn. The values Sn being writable in the form of an imaginary number $Sn=S_In+i \cdot S_Qn$, where $S_In$ and $S_Qn$ are real numbers and where $i^2=-1$, the values Pn are obtained successively from the successive values Sn by performing for each the calculation $Pn=S^2_In+S^2_Qn$. The values Pn are therefore coded on 2p bits.

The unit further comprises, according to the invention, N mean power calculation modules arranged in cascade, where N is an integer. Each of these modules, referenced $103_1$ to $103_N$ in FIG. 1, allows the continuous production of the series of values $P_1n$ to $P_Nn$ respectively of the mean power of the input signal, calculated over increasing respective time windows directly or indirectly from the values Pn of the series of values of the instantaneous power of the input signal. The modules $103_1$ to $103_N$ are in what follows called modules for calculating mean power of level 1 to N respectively. These are synchronous modules.

The module $103_1$ for calculating mean power of level 1 comprises a memory register $104_1$, as well as a counter $C_1$ (not represented) counting up to $N_1$, where $N_1$ is an integer such that $N_1 \geq 2$, (not represented) and means for resetting to zero the register $104_1$ and the counter $C_1$ (also not represented). It further comprises means of addition $105_1$, a first input of which is coupled to the output of the circuit 102 for calculating instantaneous power so as to receive the values Pn of the instantaneous power of the input signal, a second input of which is coupled to an output of the register $104_1$ so as to receive the current value stored in this register, and the output of which is coupled to the input of said register $104_1$. With each reception of a new value Pn, the means of addition $105_1$ produce a value equal to the sum of said value Pn and of said current value stored in the register $104_1$ this sum value being then stored in the register $104_1$ in place of said current value. Stated otherwise, the hereinabove means of the module $103_1$ form an accumulator register. Such a register is of very simple structure and requires little memory space, since the register $104_1$ must have a length enabling it to store the result of the addition of N1 words of 2p bits, that is equal to 2p+N1 only.

The module $103_1$ for calculating the mean power of level 1 outputs a series of values $P_1n$ which are obtained successively for example by averaging over $N_1$ successive values Pn of the instantaneous power of the input signal. Preferably, this is an arithmetic mean, which is the simplest to implement since it requires just one complex step of division by $N_1$. Accordingly, the counter is incremented by one unit with each reception of a new value Pn and corresponding updating of the value stored in the register $104_1$. When the counter reaches the value $N_1$ the value stored in the register $104_1$ is divided by N1 to yield an arithmetic mean of the last $N_1$ successive values Pn of the instantaneous power of the input signal which were received at the input of the module $103_1$. A value $P_1n$ of the mean power of level 1 of the input signal is thus produced. Moreover, the value of the counter $C_1$ and the value stored in the register $104_1$ are reset to zero. Preferably, the integer $N_1$ is an integer power of 2, that is there exists a nonzero integer $k_1$ such that $N_1=2^{k_1}$. This makes it possible to simplify the step of division by $N_1$ since it is then sufficient to eliminate the $N_1$ least significant bits of the value stored in the register $104_1$ to produce the value $P_1n$.

Each circuit $103_j$ for calculating the mean power of level j, where j is an index such that $2 \leq j \leq N$, produces a j-th series of values $P_jn$ of the mean power of level j of the input signal from $N_j$ values of the j-1-th series of values $P_{j-1}n$ of the mean power of level j-1 of the input signal, where $N_j$ is an integer such that $N_j \geq 2$. It is necessary to distinguish between the last module $103_N$ (for which j=N) and the other modules $103_j$ (for which $2 \leq j < N$).

For the values of j such that $2 \leq j < N$, the values of the j-th series of values $P_jn$ of the mean power of the input signal are obtained successively by averaging over successive $N_j$-tuples of successive values of the j-1-th series of values $P_{j-1}n$ of the mean power of level j-1 (immediately lower level) of the input signal. Preferably, this is an arithmetic mean, which is the simplest to implement since it requires few complex calculations.

Accordingly, each module $103_j$ for calculating the mean power of level j can have the same structure as the module $103_1$ for calculating the mean power of level 1 described hereinabove, with a counter $C_j$ counting up to $N_j$.

Nevertheless, in a preferred exemplary embodiment, each module $103_j$ for calculating the mean power of level j comprises, in place of the memory register $104_1$ of the module $103_1$, a shift register $104_j$ of length $N_j$, that is comprising $N_j$ elementary registers in series, as well as a counter $C_j$ (not represented) counting up to $N_j$ and means (also not represented) for resetting to zero the counter $C_j$ and optionally the register $104_j$. It further comprises means of addition $105_j$ with $N_j$ inputs which are linked respectively to the outputs of the $N_j$ elementary registers $104_j$ so as to receive the $N_j$ values stored in the shift register $104_j$. The input of each module $103_j$ is coupled to the output of the module $103_{j-1}$ so as to receive the values $P_{j-1}n$ and its output is coupled to the input of the module $103_{j+1}$ so as to send it the values $P_jn$. Each time a value $P_{j-1}n$ is input into the shift register $104_j$, the counter $C_j$ is incremented by one unit. When $N_j$ values $P_{j-1}n$ of the mean power of level j-1 (immediately lower level) have been input into the shift register $104_j$, that is when $C_j=N_j$, these $N_j$ values are added together in the adder $105_j$. The sum obtained is then divided by $N_j$ to produce a value $P_jn$ of the mean power of level j of the input signal. Moreover, the shift register $104_j$ can be emptied of the values which it contains, by virtue of the abovementioned means for resetting to zero. Preferably, each integer $N_j$ is an integer power of 2, that is there exists an integer $k_j$ such that $N_j=2^{k_j}$. This simplifies the step of division by $N_j$, as has been set forth previously.

The structure of the modules $103_j$ for calculating mean power of level j for $2 \leq j < N$ thus enable them to keep in memory, in the shift register $104_j$, the previous values of the mean power of level j-1. This history of the values of the mean power can thus be used at any instant, as will be described hereinbelow.

Let us now see the particular case of the last module $103_N$. The values of the last series of values $P_Nn$ of the mean power of level N of the input signal are obtained successively by taking a sliding average over the successive $K_N$-tuples of the last $N_N$ values of the N-1-th series of values $P_{N-1}n$ of the mean power of level N-1 (immediately lower level) of the input signal.

Accordingly, the module $103_N$ for calculating the mean power of level N can have the same structure as the module $103_1$ for calculating the mean power of level 1 described earlier, with a counter $C_N$ counting up to $N_N$, but which is not reset to zero after the calculation of each value $P_Nn$.

Nevertheless, in a preferred exemplary embodiment, the module $103_N$ for calculating the mean power of level N of the input signal comprises a shift register $104_N$ of length $N_N$, that is comprising $N_N$ elementary registers in series, and an adder $105_N$ with $N_N$ inputs for receiving respectively the $N_N$ values stored in the shift register $104_N$, where $N_N$ is an integer. The input of the module $103_N$ is coupled to the output of the module $103_{N-1}$ for calculating the mean power of level N-1 (immediately lower level). With each input of a new value $P_{N-1}n$ of the mean power of level N-1 of the input signal into the shift register $104_N$, the values which are stored therein are shifted so that the oldest value $P_{N-1}n$ stored in the shift register $104_N$ is lost. A counter $C_N$ (not represented) able to count up to $N_N$ is incremented by one unit with each input of a new value $P_{N-1}n$ into the shift register $104_N$. Moreover, a sum of the $N_N$ values newly stored in this register is calculated by virtue of the means of addition $105_N$. As soon as the counter has reached the value $N_N$ ($C_N \geq N_N$), the sum thus obtained is divided by $N_N$ to produce the value $P_Nn$ of the mean power of level N of the input signal, according to (preferably) an arithmetic mean. Preferably, the integer $N_N$ is an integer power of 2, that is there exists an integer $k_N$ such that $N_N=2^{k_N}$, this simplifying the step of division by $N_N$ as was set forth previously. This calculation produces a value $P_Nn$ of the mean power of level N of the input signal. The counter $C_N$ is not reset to zero after the calculation of each value $P_Nn$.

The modules $104_1$ to $104_N$ for calculating the mean power of level 1 to N respectively of the input signal are for example embodied in the form of hardware and/or software modules, for example in a microcontroller, an ASIC circuit, a DSP circuit, an FPGA circuit, or the like.

As will have been understood, the successive values Pn of the instantaneous power of the input signal which are delivered by the circuit 102 bring about the cascaded generation of the series of values $P_1n$ to $P_Nn$ of the mean power of level 1 to N respectively of the input signal. Thus, a value $P_1n$ of the mean power of level 1 is a value of the input signal mean power calculated over a time window of width equal to $N_1$ times an elementary duration separating two successive values Pn of the instantaneous power of the input signal. This elementary duration is equal to $$\frac{1}{fe \times fse}.$$

Likewise, a value $P_2n$ of the mean power of level 2 is a value of the input signal mean power calculated over a time window of width equal to $N_1 \times N_2$ times this elementary duration. Expressed in a general manner, this signifies that a value $P_jn$ of the mean power of level j of the input signal is a value of the signal S mean power calculated over a time window of width equal to $N_1 \times N_2 \times \ldots \times N_{j-1} \times N_j$ times the duration separating two consecutive values Pn of the instantaneous power of the input signal. These time windows are therefore of respective increasing widths.

Thus, the more the level j of the mean power of the input signal increases, the more the small variations in the values of the input signal are masked in the value $P_jn$ of this mean power of level j. Nevertheless, the smaller the level of this mean power, the more quickly are the values $P_jn$ of the mean power available after the unit has been switched on. In one example, N is equal to five, $N_1$, $N_4$ and $N_5$ are equal to eight, and $N_2$ and $N_3$ are equal to two. Moreover, the values of the power in the converted band and/or the values of the power in the useful channel which are taken into account in an initialization phase are the values $P_1n$ of mean power of level 1 which are calculated over a time window having a first determined width, while the values of the power in the converted band and/or the values of the power in the useful channel which are taken into account in a holding phase are the values $P_5n$ of mean power of level 5 which are calculated over a time window having a second determined width, greater than said first determined width. Of course, values of the mean power of different levels may be taken into account for the power in the converted band and for the power in the useful channel. In one example, the initialization phase is considered to begin when the device is brought into service and to terminate as soon as a value $P_5n$ of the mean power of level 5 in the useful channel is available. However, the device is brought back to the initialization phase and the memory registers and the counters Ci for i lying between 1 and N of the units 18 and 20 are reinitialized with each modification of the value of the gain of the amplifier 15. Moreover, and preferably, the values of the power in the frequency band of the converted signal and/or the values of the power in the useful channel which are taken into account are calculated on the basis of measurements of the instantaneous power after a first determined lag has elapsed after bringing into service or modifying a parameter of an analog part upstream of the analog/digital converter.

The values $P_B$ of the power in the converted band and the values $P_C$ of the power in the useful channel which are produced respectively in the units 18 and 20, are by nature decimal values on a linear scale. They are for example expressed in watts (W) or in milliwatts (mW). Moreover, the mean power values are calculated from values in watts or in milliwatts. Nevertheless, it is advantageous to express them in decibel milliwatts (dBm), that is on a logarithmic scale. Specifically, the values of the gain of the amplifier 15 which can be controlled by the gain control signal delivered by the management unit 21 are generally expressed in dB. Likewise, the saturation value Psat and the noise floor Pmin of the converter 16 are generally expressed in dBm in the specifications. Also, the mean power level $P_C$o desired in the useful channel and the mean power level $P_B$o desired in the converted band are expressed in dBm. As was stated earlier, all these values can be expressed through a deviation in dB with respect to the value Pmin of the noise floor of the converter expressed in dBm. Likewise, various margins used in the comparison steps can be expressed in dB. It is indeed advantageous to deal with values expressed in dB, since operations of multiplication or of division on values expressed linearly are then performed by means of simpler operations of addition and of subtraction respectively.

This is why the values $P_B$ of the power in the converted band and the values $P_C$ of the power in the useful channel are converted into values in decibels by means of a predetermined conversion table stored for this purpose in the units 18 and 20 respectively. Such a table can take the form given by table I below. In the unit 20, there exists such a table for each type of power measurement of a channel (sampling frequency, channel filter used) lying in the frequency band of the radiocommunication signal S. In each of these tables, each column corresponds to one of the predetermined values which can be taken by the gain of the amplifier 15. These gain values go from a minimum value Gmin to a maximum value Gmax with a stepsize of for example 1 dB. Advantageously, the power values converted into decibels by means of the table are then independent of the current value of the gain G of the amplifier 15.

Likewise each row of the table corresponds to a measured power value going from a minimum value Pmin, which corresponds to the value of the noise floor of the converter possibly increased by a margin, to a maximum value $P_B$max (for the power in the converted band) or $P_C$max (for the power in the useful channel), with a stepsize $\Delta P$ of for example 0.5 dB. Each row of the table therefore corresponds to an index j such that the power value indicated in this row corresponds to Pmin+j.$\Delta P$ for j going from 0 to Np, where Np is an integer.

TABLE I

| Index | $P_B$ | Gmin | ... | ... | ... | ... | ... | Gmax |
|---|---|---|---|---|---|---|---|---|
| 0 | Pmin | X | X | X | X | X | X | X |
| 1 | Pmin + $\Delta P$ | X | X | X | X | X | X | X |

TABLE I-continued

| Index | $P_B$ | Gmin | ... | ... | ... | ... | ... | Gmax |
|---|---|---|---|---|---|---|---|---|
| 2 | Pmin + 2.$\Delta P$ | X | X | X | X | X | X | X |
|   |   | X | X | X | X | X | X | X |
| . | . | | | | | | | |
| j | Pmin + j.$\Delta P$ | X | X | X | X | X | X | X |
|   |   | X | X | X | X | X | X | X |
| . | . | | | | | | | |
| Np | Pmin + Np$\Delta P$ | X | X | X | X | X | X | X |

The conversion of any power value is carried out as follows. The value to be converted, expressed in watts or in milliwatts, is compared with the values from the column of the table corresponding to the current value of the gain G of the amplifier 15, which values are expressed in the same unit (W or mW). It is perhaps equal to one of these values or lies between two of these values contained in two adjacent rows of the table. If it is less than Pmin or greater than Pmin+Np$\Delta p$, it is set to Pmin or to Pmin+Np$\Delta p$, respectively. From this is then deduced the value of the index j corresponding to the row of the table whose value, for the relevant column, is closest to the value to be converted. The value of this index is saved in memory and is used to compare the power value with other power values converted in the same way. It was seen that Pmin corresponds to the zero value of the index j. In one example, Psat corresponds to the value Np of the index j. Stated otherwise, Psat=Pmin+Np.$\Delta p$. Index values (integers) are thus compared, instead of comparing values in watts or in milliwatts (decimal numbers). This is simpler. Moreover, the index values can be saved in place of the corresponding values in watts or in milliwatts. This occupies less room in memory.

Figure 3:
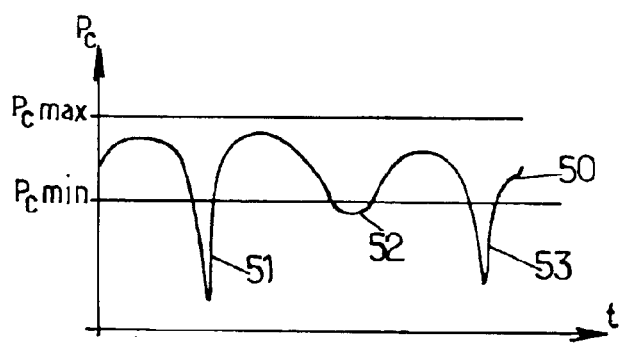
FIG. 3 is a curve illustrating the profile over time of the power of the signal in a useful channel.

In FIG. 3, the curve 50 represents an example of the profile versus time of the power $P_C$ in a determined useful channel. Horizontal lines represent an interval around a desired predetermined mean power level $P_C$o which is regarded as satisfactory for the channel taking into account the input dynamic swing in power of the analog/digital converter 16. This interval is delimited by an acceptable maximum value $P_C$max and by an acceptable minimum value $P_C$min.

In case of static propagation in this channel, that is when the corresponding transmitter is fixed with respect to the receiver, the power $P_C$ hardly varies over time. Its slight fluctuations are due only to parasitic glitches in the channel. In case of dynamic propagation in the channel, that is when the corresponding transmitter is moving with respect to the receiver, the power $P_C$ varies somewhat more, and it may pass below the level $P_C$min as indicated for example by the reference 52 in FIG. 3, or above the level $P_C$max.

According to the invention, the desired mean power level $P_C$o, and possibly also the deviation between the acceptable minimum level $P_C$min and/or acceptable maximum level $P_C$max on the one hand and $P_C$o on the other hand, depend on the type of propagation in the useful channel. In one example, the values of $P_C$o, $P_C$min and $P_C$max are respectively equal to 4 dB, 7 dB and 10 dB above the noise floor Pmin of the analog/digital converter 16 ($P_C$min=Pmin+4 dB; $P_C$o=Pmin+7 dB; $P_C$max=Pmin+10 dB) in the static case, and respectively to 12 dB, 15 dB and 18 dB above Pmin ($P_C$min=Pmin+12 dB; $P_C$o=Pmin+15 dB; $P_C$max=Pmin+18 dB) in the dynamic case.

The type of propagation, static or dynamic, can be determined as a function of the state of the receiver (when the latter comprises means for detecting that it is moving), or of data received from the transmitter (when the latter comprises means for detecting and signaling that it is moving). Nevertheless, the device according to the invention preferably comprises means for determining the type of propagation, static or dynamic, in the useful channel as a function of the history of the values of the power in the useful channel which are obtained in the absence of saturation of the analog/digital converter as will be explained in greater detail hereinbelow in conjunction with FIG. 5.

When the signal in the channel is in a "fading hole", the power $P_C$ in this channel may suddenly become less than the minimum level $P_C$min, as indicated for example by the references 51 and 53 in FIG. 3. However, this sudden decrease in the power in the useful channel is of short duration. Consequently, it may be preferable not to modify the gain of the variable-gain amplifier 15 (FIG. 1) on account of the power measurements in such a "fading hole".

This is why the device comprises means for determining whether the signal in the useful channel is in a "fading hole", and for modifying the gain of the amplifier 15, as appropriate, only if the signal in the useful channel is not in a "fading hole". A "fading hole" is detected by the abrupt variation of the successive values of the power $P_C$ in the channel, as will be explained in greater detail hereinbelow in conjunction with FIG. 6.

Figure 4:
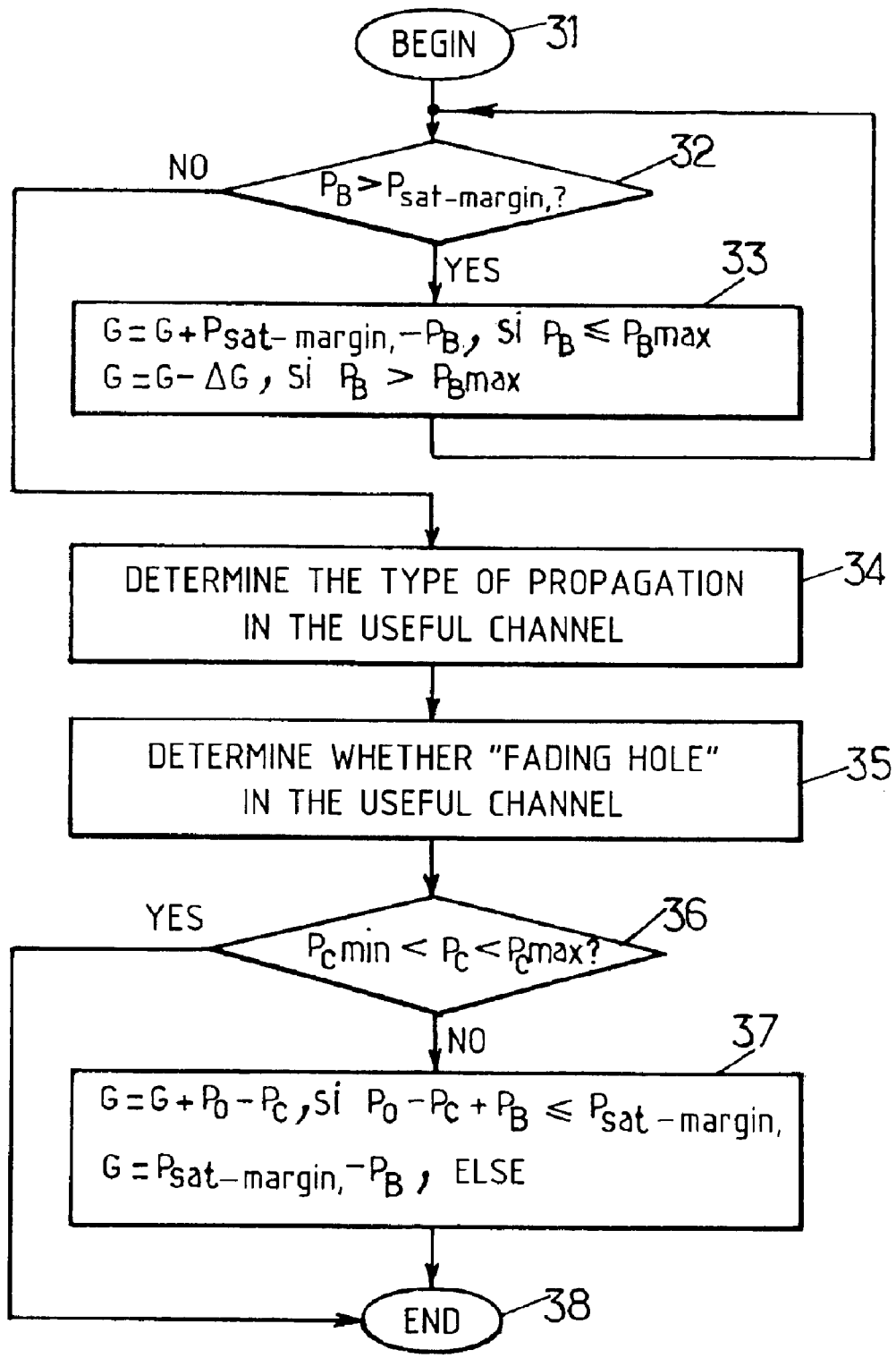
FIG. 4 is a flow chart of the steps of the method according to the invention.

The manner of operation of the device, according to the method of the invention, is described hereinbelow with reference to the flow chart of FIG. 4.

When the receiver is switched on, the device operates according to an initialization phase. Subsequently, it operates according to a holding phase. The method of analog/digital conversion whose steps are represented on the flow chart of FIG. 4 and implemented both during the initialization phase and during the holding phase. It will be now be described in the case of the initialization phase. This description is, making the necessary alterations which will be pointed out, also valid for the implementation in the holding phase. It will therefore not be repeated for the latter, so as to avoid a redundancy.

The method begins with a step 31 consisting in assigning a predetermined initial value to the gain G of the amplifier 15, which normally makes it possible to avoid the saturation of the analog/digital converter 16. A step 32 then consists in comparing a value $P_B$ of the power in the converted band with the limit saturation value Psat. If $P_B$ is not greater than Psat minus a predetermined margin, we then go to a step 34. If on the contrary $P_B$ is greater than Psat minus said margin, then, in a step 33, the gain G of the amplifier 15 is decreased in such a way that the power $P_B$ in the converted band is substantially equal to a desired value $P_B$o less than or equal to Psat minus said margin. For this purpose, two cases are distinguished. If $P_B$ is less than or equal to $P_B$max, then the current value G of the gain of the amplifier 15 is replaced by G+$P_B$o–$P_B$. If on the contrary $P_B$ is strictly greater than $P_B$max, then the current value G of the gain of the amplifier 15 is replaced by G–ΔG, where ΔG constitutes a relatively high variation in the gain relative to the gain stepsize of the conversion table (which is 0.5 dB). For example ΔG equals 2 dB. After step 33 we return to the comparison step 32. In this way, possibly after several iterations of step 33, the gain G of the amplifier 15 is such that the power $P_B$ in the converted band is at most substantially equal to the value $P_B$o of the mean power level desired in the converted band.

Step 34 consists in determining the type of propagation, static or dynamic, in the useful channel as a function of the history of the values $P_C$ of the power in the useful channel which are obtained in the absence of saturation of the converter 16. It will be detailed hereinbelow in conjunction with the flow chart of FIG. 5. It is followed by a step 35 of determining a possible "fading hole" in the useful channel. This step 35 will be detailed hereinbelow in conjunction with the flow chart of FIG. 6.

Next, the method comprises a step 36 consisting in comparing a value $P_C$ of the power in the useful channel with the mean power level $P_C$o desired in this channel.

More exactly, a check verifies whether the value $P_C$ lies in the interval around $P_C$o defined by the values $P_C$min and $P_C$max. If $P_C$ is not outside this interval, then the end 38 of the method has been reached. Conversely, if $P_C$ is outside this interval, then, in a step 37, the gain G of the amplifier 15 is modified so that the value $P_C$ is inside said interval. However, this modification of the value of the gain G must not entail any risk of the saturation of the converter 16. This is why a test for validating change of the gain is performed so as to verify that the envisaged new value of the gain does not entail any risk of saturation of the converter 16. The new value of the gain which is envisaged to replace the current value G is for example G+$P_C$o–$P_C$. The test for validating the change of gain consists in comparing the value $P_B$ of the power in the converted band with the limit saturation value Psat of the converter 16. More exactly, if $(P_C o - P_C) + P_B \leq$ Psat–margin, then the envisaged new value of gain can be adopted since there is no risk of it causing the saturation of the converter 16. Otherwise, the new value of the gain must be limited to Psat–margin–$P_B$. In this way, priority is given to the avoiding of the saturation of the converter 16 over the obtaining of the best possible sensitivity in the useful channel. Stated otherwise the gain of the amplifier is controlled in such a way that the power in the useful channel is substantially equal to the predetermined mean power level $P_C$o. Thus, the gain of the amplifier is increased at most by only a value such that the power in the converted band remains less than the limit saturation value Psat of the converter 16 minus said determined margin.

After step 37 we are at the end 38 of the method. Nevertheless, steps 32 to 37 may be repeated cyclically both during the initialization phase and during the holding phase.

Figure 5:
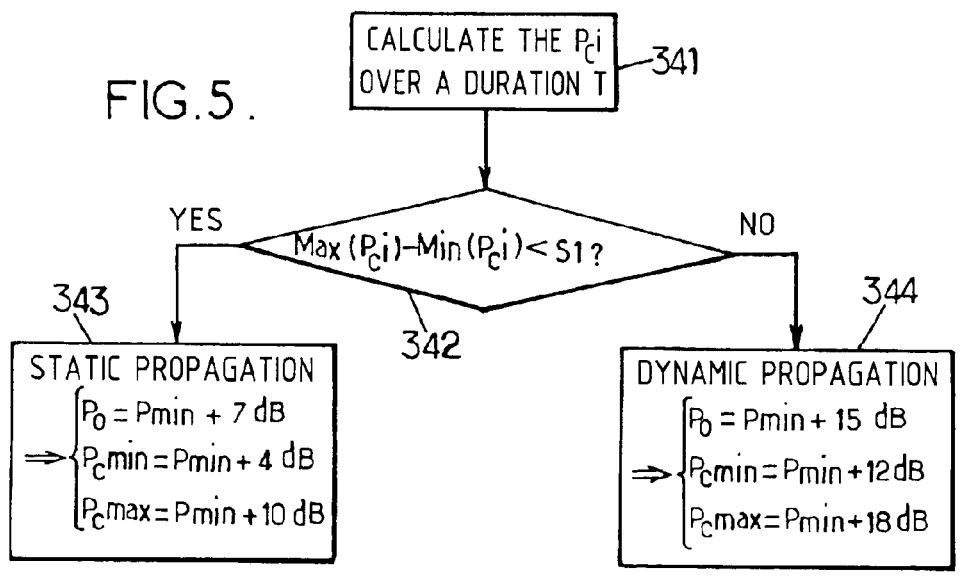
FIG. 5 and FIG. 6 are flow charts detailing substeps respectively of a step of determining the type of propagation in the useful channel and a step of determining a "fading hole" of the signal in the useful channel.

Represented in FIG. 5 is a flow chart showing substeps of step 34 of determining the type of propagation in the useful channel.

During substep 341, the values $P_C$i of the instantaneous power of the useful channel are produced and kept over a duration T. The value of T depends on a speed v of the mobile above which the mobile is regarded as being in the dynamic regime and below which the mobile is regarded as being in the static regime. T must then be greater than the period of the fadings, that is greater than $1/(2^*f_d)$, where $f_d$ represents the Doppler frequency, given by the expression $f_d = f^* v/c$; f represents the carrier frequency of the signal and c the speed of light. To dimension T, the variations of f from one channel to another of one and the same system are disregarded. By way of example, the value of v is fixed at 10 km/h.

During step 342, the maximum and the minimum of the power values $P_C$i over the time interval T are calculated. These two values can also be calculated using respectively the N largest values (in place of the maximum) or the N smallest values (in place of the minimum). The deviation between these two extreme values will make it possible to update the regime to be considered.

If the deviation is less than a threshold $S_1$, this signifies that the power $P_Ci$ has varied little over the time interval T and that the propagation is of the static type in the useful channel. A substep 343 is then performed which consists in assigning a value corresponding to this type of propagation to the predetermined mean power level $P_Co$. If conversely the difference is greater than the threshold $S_1$, then this signifies that the power $P_Ci$ has varied significantly over the time interval T and hence that the propagation is of the dynamic type. A step 344 is then performed which consists in assigning a value corresponding to this type of propagation to the predetermined power level $P_Co$.

In one example, in step 343 the value Pmin+7 dB is given to Po, that is the predetermined mean power level is 7 dB above the value Pmin of the noise floor of the converter 16. Correspondingly, the value Pmin+4 db is given to the value $P_C$min, this signifying that the acceptable minimum level for the power for the useful channel is situated 4 dB above the value Pmin of the noise floor of the converter 16. Again likewise, the value Pmin+10 dB is given to the value $P_C$max, this signifying that the acceptable maximum value of the power in the useful channel is situated 10 dB above the noise floor Pmin of the converter 16. In step 344, the values Pmin+15 dB, Pmin+12 dB, and Pmin+18 db are given to the values $P_O$, $P_C$min and $P_C$max respectively.

Figure 6:
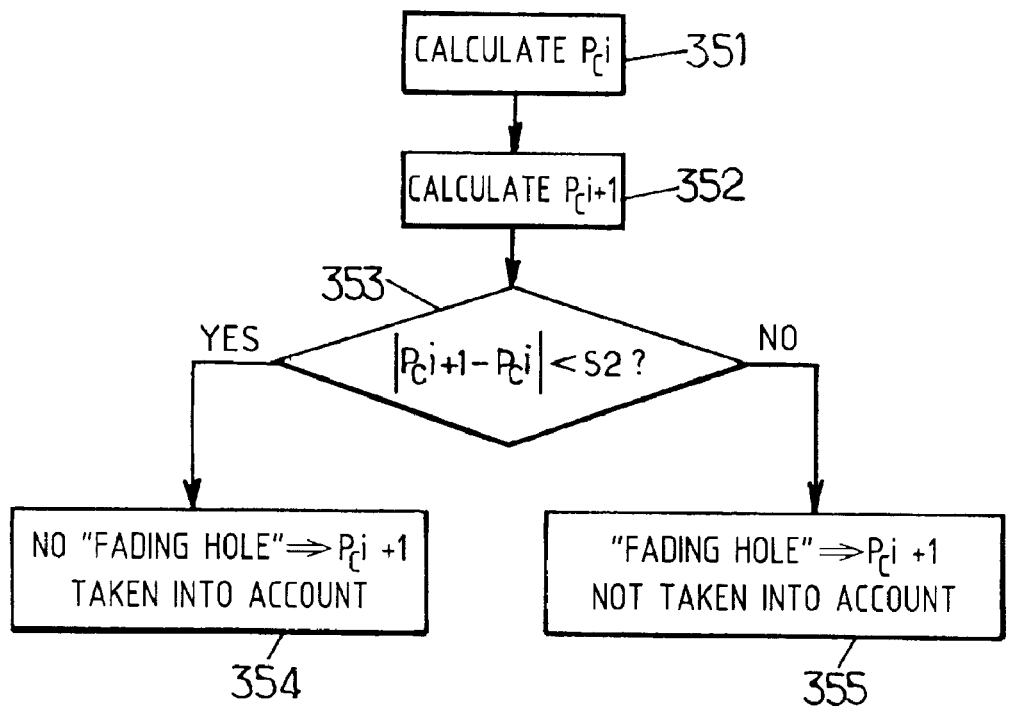

Represented in FIG. 6 is a flow chart showing substeps of step 35 of determining a "fading hole" of the signal in the useful channel.

During steps 351 and 352, partly merged with step 341 of FIG. 5, two consecutive values $P_Ci$ and $P_Ci+1$ of the power in the useful channel are produced. These two values are instantaneous values of the power in the useful channel. In a step 353, the difference $P_Ci+1-P_Ci$ between these two consecutive values is compared with a second determined threshold S2 which is greater than the threshold S1 mentioned hereinabove in conjunction with FIG. 5. If this difference is less than the threshold S2 then this signifies that the signal in the useful channel is not in a "fading hole". This is why in a step 354, the second value $P_Ci+1$ is taken into account in the calculation of the mean values $P_1n$ to $P_5n$ of the power in the useful channel. In the converse case, represented symbolically by substep 355, this signifies that the signal in the useful channel is in a "fading hole". This is why the second value $P_Ci+1$ is not taken into account in the calculation. It is quite simply ignored.

What is claimed is:

1. A method of analog/digital conversion of a radiocommunication signal whose frequency band contains at least one useful channel, using an analog/digital converter preceded by a variable-gain amplifier which receives said signal and which has a gain of a given value, the method comprising steps for controlling the value of the gain of the amplifier in such a way that power in the frequency band of the signal is less than a limit saturation value of the analog/digital converter and that power in the useful channel is substantially equal to a desired mean power level in the useful channel having a first predetermined value in the case of static propagation in the useful channel or a second predetermined value, different from said first predetermined value, in the case of dynamic propagation in the useful channel.

2. The method of claim 1 comprising the steps of:
comparing values of the power in the frequency band of the converted signal with the limit saturation value of the analog/digital converter; and
if a value of the power in the frequency band of the signal is greater than said limit saturation value of the analog/digital converter minus a predetermined margin, decreasing the gain of the amplifier in such a way that the power in the frequency band of the signal is at most substantially equal to a desired mean power level in the band of the signal.

3. The method of claim 2, wherein the values of the power in the frequency band of the converted signal and/or the values in the useful channel which are taken into account in an initialization phase are values of mean power calculated over a time window having a first determined width, while the values of the power in the frequency band of the converted signal and/or the values of the power in the useful channel which are taken into account in a holding phase are values of mean power calculated over a time window having a second determined width, greater than said first determined width.

4. The method of claim 2, wherein the values of the power in the frequency band of the converted signal and/or the values of the power in the useful channel which are taken into account are calculated on the basis of measurements of an instantaneous power after a first determined lag has elapsed after bringing into service or modifying a parameter of an analog part upstream of the analog/digital converter.

5. The method of claim 2, wherein the values of the power in the frequency band of the converted signal and/or the values of the power in the useful channel which are taken into account are calculated on the basis of measurements of an instantaneous power after a second determined lag has elapsed after the modification gain of the amplifier.

6. The method of claim 2, wherein the values of the power in the frequency band of the converted signal and/or the values of the power in the useful channel which are taken into account are converted into values in decibels independent of the gain of the amplifier by means of a predetermined conversion table.

7. The method of claim 1 comprising a step of determining the type of propagation, static or dynamic, in the useful channel.

8. The method of claim 7 wherein the type of propagation in the useful channel is determined as a function of the history of the values of the power in the useful channel which are obtained in the absence of saturation of the analog/digital converter.

9. The method of claim 1 comprising the steps of:
comparing values of the power in the useful channel with said determined mean power level;
if a value of the power in the useful channel is outside a determined interval around said determined mean power level, modifying the gain of the amplifier so that the value of the power in the useful channel is inside said determined interval.

10. The method of claim 9, wherein the gain of the amplifier is controlled in such a way that the power in the useful channel is substantially equal to said determined mean power level.

11. The method of claim 9, wherein the gain of the amplifier is increased, at most, only by a value such that the power in the frequency band of the converted signal remains less than the limit saturation value of the analog/digital converter minus said determined margin.

12. The method of claim 9, further comprising a step of determining whether the signal in the useful channel is situated in a fading hole, the gain of the amplifier being modified, if appropriate, only if the signal in the useful channel is not situated in a fading hole.

13. A device for analog/digital conversion of a radiocommunication signal whose frequency band contains at least one useful channel, comprising an analog/digital converter preceded by a variable-gain amplifier which receives said signal and which has a gain of a given value, and means for controlling the value of the gain of the amplifier in such a way that power in the frequency band of the converted signal is less than a limit saturation value of the analog/digital converter and that power in the useful channel is substantially equal to a desired mean power level having a first predetermined value in the case of static propagation in the useful channel or a second predetermine value, different from said first predetermined value, in the case of dynamic propagation in the useful channel.

14. The device of claim 13 comprising:
means for comparing values of the power in the frequency band of the converted signal with the limit saturation value of the analog/digital converter; and
means for decreasing the gain of the amplifier in such a way that the power in the frequency band of the converted signal is at most substantially equal to said limit value minus a determined margin, if a value of the power in the frequency band of the converted signal is greater than said limit saturation value of the analog/digital converter minus said determined margin.

15. The device of claim 13 further comprising means for determining the type of propagation, static or dynamic, in the useful channel as a function of the history of the values of the power in the useful channel which are obtained in the absence of saturation of the analog/digital converter.

16. The device of claim 13, further comprising:
means for comparing values of the power in the useful channel with said predetermined mean power level; and
means for modifying the gain of the amplifier so that the value of the power in the useful channel is inside a determined interval around, said determined mean power level, if a value of the power in the useful channel is outside said determined interval.

17. The device of claim 16, further comprising means for determining whether the signal in the useful channel is situated in a fading hole, the gain of the amplifier being modified, if appropriate, only if the signal in the useful channel is not situated in a fading hole.

18. The device of claim 13, further comprising a first unit for measuring power delivering first values of the power in the frequency band of the converted signal which are values of mean power calculated over a time window having a first determined width, and second values of the power in the frequency band of the converted signal which are values of mean power calculated over a time window having a second determined width, greater than said first determined width.

19. The device of claim 18, wherein the first and/or the second unit for measuring power comprise:
a) means for producing a series of successive samples of the signal;
b) means for producing a series of successive instantaneous power values of the signal, each of these values being obtained from the value of a respective sample of the series of successive samples of the signal;
c) means for producing N series of successive values of the mean power of the signal over respectively N time windows of respective increasing widths, where N is an integer such that $N \geq 2$, from the values of the series of successive values of the instantaneous power of the signal.

20. The device of claim 18 further comprising a management unit connected to the output of the first and/or of the second unit for measuring power so as to receive respectively the values of the power in the frequency band of the converted signal and/or respectively the values of the power in the useful channel, and means for compensating for any difference of delay in the transmission of these respective values which is due to a difference of the paths taken, so as to deliver at the input of said management unit values of the power in the converted band and values of the power in the useful channel referring to identical samples of the converted signal of the converted signal.

21. The device of claim 13, further comprising a second unit for measuring power delivering first values of the power in the useful channel which are values of mean power calculated over a time window having a first determined width, and second values of the power in the useful channel which are values of mean power calculated over a time window having a second determined width, greater than said first determined width.

* * * * *

UNITED STATES PATENT AND TRADEMARK OFFICE
CERTIFICATE OF CORRECTION

PATENT NO. : 6,940,442 B2
DATED : September 6, 2005
INVENTOR(S) : Van Schendel et al.

It is certified that error appears in the above-identified patent and that said Letters Patent is hereby corrected as shown below:

Column 15,
Line 10, "predetermine" should be -- predetermined --.

Signed and Sealed this

Twenty-ninth Day of November, 2005

JON W. DUDAS
*Director of the United States Patent and Trademark Office*